(12) United States Patent
Takamine

(10) Patent No.: US 7,369,016 B2
(45) Date of Patent: *May 6, 2008

(54) BALANCED SAW FILTER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/736,853

(22) Filed: Apr. 18, 2007

(65) Prior Publication Data

US 2007/0188271 A1 Aug. 16, 2007

Related U.S. Application Data

(63) Continuation of application No. PCT/JP2005/018755, filed on Oct. 12, 2005.

(30) Foreign Application Priority Data

Nov. 4, 2004 (JP) .............................. 2004-320550

(51) Int. Cl.
*H03H 9/64* (2006.01)

(52) U.S. Cl. ...................... 333/193; 333/195

(58) Field of Classification Search ................ 333/193, 333/195

See application file for complete search history.

(56) References Cited

U.S. PATENT DOCUMENTS

| | | | |
|---|---|---|---|
| 5,717,367 A | 2/1998 | Murai | |
| 5,994,980 A | 11/1999 | Tada | |
| 6,420,946 B1 * | 7/2002 | Bauer et al. ................. | 333/193 |
| 6,583,691 B2 | 6/2003 | Takamine | |
| 6,667,673 B1 | 12/2003 | Strauss | |
| 6,759,928 B2 | 7/2004 | Endou et al. | |
| 6,781,485 B2 * | 8/2004 | Takamine et al. ........... | 333/195 |
| 2004/0066115 A1 | 4/2004 | Takamine | |
| 2004/0080383 A1 * | 4/2004 | Takamine .................... | 333/194 |
| 2004/0080385 A1 | 4/2004 | Takamine et al. | |
| 2005/0212621 A1 * | 9/2005 | Takamine .................... | 333/195 |

(Continued)

FOREIGN PATENT DOCUMENTS

JP 07-176973 A 7/1995

(Continued)

OTHER PUBLICATIONS

Official Communication for PCT Application No. PCT/JP2005/018755; mailed on Jan. 17, 2006.

*Primary Examiner*—Barbara Summons
(74) *Attorney, Agent, or Firm*—Keating & Bennett, LLP

(57) ABSTRACT

In a balanced SAW filter, a second IDT and a fourth IDT of a five IDT type first longitudinally-coupled-resonator SAW filter element are connected via first and second wiring lines to a seventh IDT and a ninth IDT of a five IDT type second longitudinally-coupled-resonator SAW filter element, respectively. First, third, and fifth IDTs are connected to an unbalanced terminal. A sixth IDT and a first sub-IDT portion are connected to a first balanced terminal. A second sub-IDT portion and a tenth IDT are connected to a second balanced terminal. The IDTs are arranged such that the phase of an electrical signal transmitted through the first wiring line differs by 180 degrees from the phase of an electrical signal transmitted through the second wiring line.

5 Claims, 2 Drawing Sheets

U.S. PATENT DOCUMENTS

2007/0171003 A1* 7/2007 Takamine .................. 333/195

FOREIGN PATENT DOCUMENTS

| JP | 08-265087 A | 10/1996 |
|---|---|---|
| JP | 10-117123 A | 5/1998 |
| JP | 11-097966 A | 4/1999 |
| JP | 2000-091883 A | 3/2000 |
| JP | 2002-009587 A | 1/2002 |
| JP | 2002-300004 A | 10/2002 |
| JP | 2003-507917 A | 2/2003 |
| JP | 2004-088551 A | 3/2004 |
| JP | 2004-096244 A | 3/2004 |
| WO | 02/03549 A1 | 1/2002 |

* cited by examiner

BALANCED SAW FILTER

BACKGROUND OF THE INVENTION

1. Field of the Invention

The present invention relates to a balanced SAW filter having a balanced-to-unbalanced transforming function, and in particular, the present invention relates to a balanced SAW filter including five IDT type first and second longitudinally-coupled-resonator SAW filter elements that are connected in a cascade arrangement.

2. Description of the Related Art

Surface acoustic wave (SAW) filters are widely used as band-pass filters in mobile communication devices, such as cellular phones. In particular, as cellular phones and other mobile communication devises become smaller and have higher performance, so-called balanced SAW filters with a balanced-to-unbalanced transforming function are used as RF band-pass filters connected to antenna terminals. An exemplary balanced SAW filter of this type is disclosed in Japanese Unexamined Patent Application Publication No. 2000-91883 (Patent Document 1), which will be described below.

As shown in FIG. 3, a balanced SAW filter 100 described in Patent Document 1 includes first and second longitudinally-coupled-resonator SAW filter elements 101 and 102, which are connected in a cascade arrangement. The first longitudinally-coupled-resonator SAW filter element 101 includes first to fifth IDTs 111 to 115 arranged in a propagation direction of surface acoustic waves. Reflectors 116 and 117 are disposed on either side of an area in which the IDTs 111 to 115 are disposed.

Similarly, the second longitudinally-coupled-resonator SAW filter element 102 includes sixth to tenth IDTs 121 to 125 arranged in the propagation direction of surface acoustic waves, and reflectors 126 and 127.

One end of each of the second and fourth IDTs 112 and 114 is commonly connected to an unbalanced terminal 131. One end of each of the first, third, and fifth IDTs is commonly connected. The other end of the first IDT 111 is connected via a first wiring line 141 to the sixth IDT 121. Similarly, the third and fifth IDTs 113 and 115 are connected via second and third wiring lines 142 and 143 to the eighth and tenth IDTs 123 and 125, respectively. In contrast, one end of the seventh IDT 122 is connected to a first balanced terminal 132, and the other end of the IDT 122 is commonly connected to one end of the IDT 124. The other end of the IDT 124 is connected to a second balanced terminal 133. Since the SAW filter 100 described in Patent Document 1 has the above-described structure, the SAW filter 100 can be miniaturized and can achieve lower insertion loss.

Although the balanced SAW filter 100 includes two cascaded five IDTs type longitudinally-coupled-resonator SAW filter elements 101 and 102, signals having the same phase flow through the first to third wiring lines 141 to 143. In contrast, a wiring line 144 electrically connecting the second balanced terminal 133 to the ninth IDT 124 is, as shown in FIG. 3, extracted between the second and third wiring lines 142 and 143 beyond a portion in which the first and second wiring lines 141 and 142 are disposed. A wiring line 145 connecting the first balanced terminal 132 to the IDT 122 is disposed in an area separated from an area in which the first to third wiring lines 141 to 143 are disposed.

Therefore, direct waves based on stray capacitance between the first to third wiring lines 141 to 143 and the first and second balanced terminals 132 and 133 are strong, and the strong direct waves are applied to the balanced terminals 132 and 133. The strength of the direct waves applied to the balanced terminal 133 is considerably greater than the strength of the direct wave applied to the balanced terminal 132. As a result, the balance between the balanced terminals 132 and 133 is poor.

SUMMARY OF THE INVENTION

To overcome the above-described problems, preferred embodiments of the present invention provide a balanced SAW filter having two cascaded five IDT type first and second longitudinally-coupled-resonator SAW filter elements, which not only achieve miniaturization and reduction in insertion loss, but also reduce the influence of direct waves applied to two balanced terminals.

Preferred embodiments of the present invention provide a balanced SAW filter having an unbalanced terminal and first and second balanced terminals. The balanced SAW filter includes a piezoelectric substrate, a first longitudinally-coupled-resonator SAW filter element provided on the piezoelectric substrate, the first longitudinally-coupled-resonator SAW filter element including first to fifth IDTs arranged in a propagation direction of surface acoustic waves, each IDT having a pair of bus bars, a second longitudinally-coupled-resonator SAW filter element including, on the piezoelectric substrate, sixth to tenth IDTs arranged in the propagation direction of surface acoustic waves, the eighth IDT at the center having a pair of bus bars, one of the bus bars being divided to provide first and second sub-IDT portions. The first sub-IDT portion of the eighth IDT and the sixth IDT are connected to the first balanced terminal. The second IDT segment of the eighth IDT and the tenth IDT are connected to the second balanced terminal. One ends of the first, third, and fifth IDTs are connected to the unbalanced terminal. The balanced SAW filter further includes a first wiring line connecting the second IDT to the seventh IDT, and a second wiring line connecting the fourth IDT to the ninth IDT. The first to tenth IDTs are arranged such that the phase of an electrical signal transmitted through the first wiring line differs by 180 degrees from the phase of an electrical signal transmitted through the second wiring line.

In one preferred embodiment of the balanced SAW filter according to the present invention, the bus bar of the eighth IDT of the second longitudinally-coupled-resonator SAW filter element, which is opposite to a side connected to the first and second balanced terminals, is grounded.

In another preferred embodiment of the balanced SAW filter according to the present invention, the bus bar of the eighth IDT of the second longitudinally-coupled-resonator SAW filter element, which is opposite to a side connected to the first and second balanced terminals, is electrically floating.

The balanced SAW filter according to preferred embodiments of the present invention includes a five IDTs type first longitudinally-coupled-resonator SAW filter element and a five IDTs type second longitudinally-coupled-resonator SAW filter element, which are connected in a cascade arrangement. In this configuration, first ends of first, third, and fifth IDTs are connected to an unbalanced terminal, a first sub-IDT portion of an eighth IDT and a sixth IDT are connected to a first balanced terminal, and a second sub-IDT portion and a tenth IDT are connected to a second balanced terminal. The first to tenth IDTs are disposed such that the phase of an electrical signal transmitted through a first wiring line connecting the second IDT to the seventh IDT differs by 180 degrees from the phase of an electrical signal transmitted through a second wiring line connecting the fourth IDT to the ninth IDT.

Accordingly, the polarity relationship among adjacent outermost electrode fingers of the IDTs connected to the first balanced terminal and the IDT adjacent to these IDTs is the same as the polarity relationship among adjacent outermost electrode fingers of the IDTs connected to the second balanced terminal and the IDT adjacent to these IDTs. Thus, the balance between the first and second balanced terminals is outstanding.

According to preferred embodiments of the present invention, when the bus bar of the eighth IDT of the second longitudinally-coupled-resonator SAW filter element, which is opposite to a side connected to the first and second balanced terminals, is grounded, the eighth IDT is more fully grounded, and the insertion loss of the SAW filter is reduced.

When the bus bar of the eighth IDT of the second longitudinally-coupled-resonator SAW filter element, which is opposite to a side connected to the first and second balanced terminals, is electrically floating, the eighth IDT need not be provided with a grounding pad electrode. Thus, the area of the piezoelectric substrate can be reduced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the drawings to illustrate the present invention.

Figure 1:
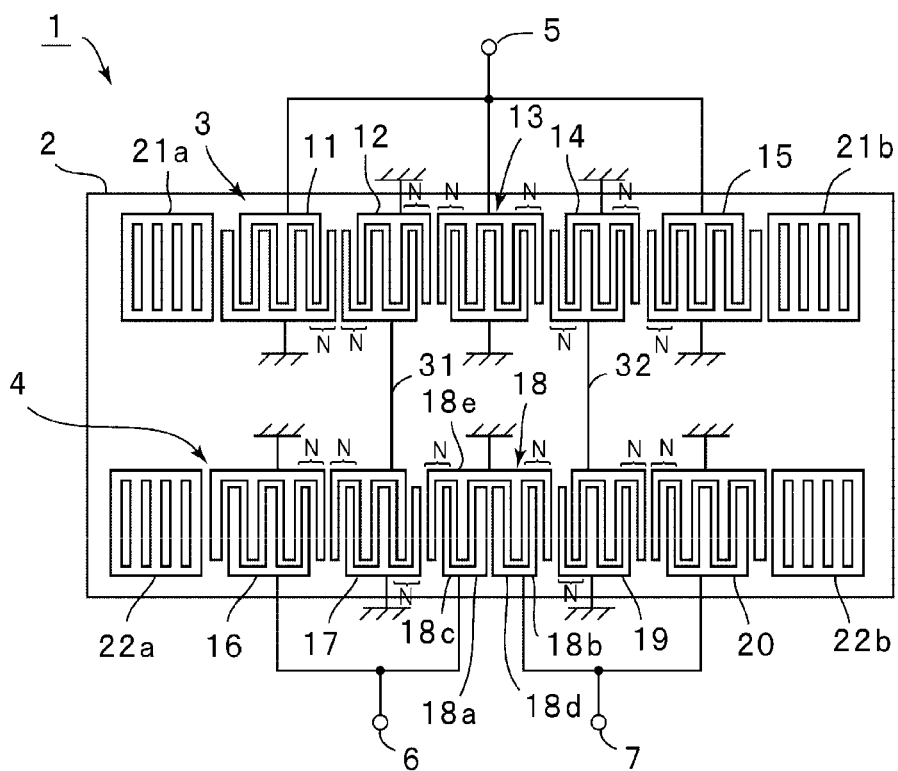
FIG. 1 is a schematic plan view of a balanced SAW filter according to a preferred embodiment of the present invention.

FIG. 1 is a schematic plan view of a balanced SAW filter according to a preferred embodiment of the present invention. A balanced SAW filter 1 according to this preferred embodiment is preferably used as a EGSM reception band-pass filter. The pass band of the EGSM reception band-pass filter is 925 MHz to 960 MHz.

The balanced SAW filter 1 includes a piezoelectric substrate 2. According to this preferred embodiment, the piezoelectric substrate 2 is preferably composed of a 40±5° Y-cut X-propagation LiTaO$_3$ substrate, for example.

Alternatively, the piezoelectric substrate may be a piezoelectric single crystal substrate having a different crystal angle or a piezoelectric ceramic substrate. Exemplary piezoelectric single crystal substrates include a 64°-72° Y-cut X-propagation LiNbO$_3$ substrate and a 41° Y-cut X-propagation LiNbO$_3$ substrate.

The piezoelectric substrate 2 includes a plurality of electrodes, which will be described later, disposed thereon. The piezoelectric substrate 2 and the electrodes define a first longitudinally-coupled-resonator SAW filter element 3 and a second longitudinally-coupled-resonator SAW filter element 4. The first and second longitudinally-coupled-resonator SAW filter elements 3 and 4 are connected in a cascade arrangement.

The first longitudinally-coupled-resonator SAW filter element 3 includes first to fifth IDTs 11 to 15 arranged on the piezoelectric substrate 2 in a propagation direction of surface acoustic waves. Each of the first to fifth IDTs 11 to 15 includes a pair of bus bars. Reflectors 21a and 21b are disposed on either side of an area in which the IDTs 11 to 15 are disposed.

First ends of the first IDT 11, the third IDT 13, and the fifth IDT 15 are commonly connected to an unbalanced terminal 5. Second ends of the IDTs 11, 13, and 15 are grounded. First ends of the second and fourth IDTs 12 and 14 are grounded, and second ends of the IDTs 12 and 14 are electrically connected to a seventh IDT 17 and a ninth IDT 19 of the second longitudinally-coupled-resonator SAW filter element 4, which will be described later.

According to this preferred embodiment, the propagation direction of surface acoustic waves in the first longitudinally-coupled-resonator SAW filter element 3 is parallel to the propagation direction of surface acoustic waves in the second longitudinally-coupled-resonator SAW filter element 4.

The second longitudinally-coupled-resonator SAW filter element 4 includes sixth to tenth IDTs 16 to 20 arranged in the propagation direction of surface acoustic waves. Each of the sixth to tenth IDTs 16 to 20 includes a pair of bus bars. Reflectors 22a and 22b are disposed on either side, in the propagation direction of surface acoustic waves, of an area in which the IDTs 16 to 20 are disposed. First ends of the seventh and ninth IDTs 17 and 19 are electrically connected via first and second wiring lines 31 and 32 to the second and fourth IDTs 12 and 14, respectively. Second ends of the seventh and ninth IDTs 17 and 19 are grounded.

The eighth IDT 18 is divided into two portions in the propagation direction of surface acoustic waves. That is, the IDT 18 has first and second sub-IDT portions 18a and 18b. The sub-IDT portions 18a and 18b are provided by dividing one of the paired bus bars into two bus bar portions 18c and 18d.

The bus bar portion 18c of the first sub-IDT portion 18a is separated by a gap from the bus bar portion 18d of the second sub-IDT portion 18c, as shown in FIG. 1. A bus bar 18e opposite to the bus bar portions 18c and 18d is disposed on the side of the first longitudinally-coupled-resonator SAW filter element 3.

In other words, one of the bus bars of the IDT 13 and the bus bar 18e of the IDT 18 face each other across a space between the first and second longitudinally-coupled-resonator SAW filter elements 3 and 4.

One end of the sixth IDT 16 and the first sub-IDT portion 18a are commonly and electrically connected to a first balanced terminal 6. The other end of the sixth IDT 16 is grounded. The other sub-IDT portion 18b and the tenth IDT 20 are commonly connected to a second balanced terminal 7. The bus bar 18e of the eighth IDT 18 is grounded. The other end of the tenth IDT 20 is grounded.

Thus, the balanced SAW filter 1 according to this preferred embodiment is a SAW filter with a balanced-to-unbalanced transforming function, which includes the unbalanced terminal 5 and the first and second balanced terminals 6.

The IDTs 11 to 15 and 16 to 20, the reflectors 21a, 21b, 22a, and 22b, and the wiring lines 31 and 32 are made of an appropriate electrode material. In this preferred embodiment, these elements are preferably made of Al.

In this preferred embodiment, in a portion in which two IDTs are adjacent to each other, narrow-pitch electrode finger portions N are provided at ends of the IDTs. For example, in a portion in which the IDT 11 and the IDT 12 are adjacent to each other, the pitch of a plurality of electrode fingers near an end of the IDT 11 toward the IDT 12 is less than the pitch of the remaining electrode fingers. This portion in which the relatively-small-pitch electrode fingers are disposed is the narrow-pitch electrode finger portion N.

Since the IDTs 12 and 14 are disposed on either side of the IDT 13, the IDT 13 has narrow-pitch electrode finger portions N at an end toward the IDT 12 and at another end toward the IDT 14. In a portion where other IDTs are adjacent to each other, narrow-pitch electrode finger portions N are disposed on the both IDTs.

By providing the narrow-pitch electrode finger portions N, discontinuity between the adjacent IDTs is reduced. The longitudinally-coupled-resonator SAW filter elements 3 and 4 achieve pass-band characteristics by coupling three resonance modes, that is, a first-order mode, a third-order mode, and a resonance mode with a resonance point depending on the distance between the IDTs. By disposing the above-described narrow-pitch electrode finger portions N, the distance between the IDTs is further adjusted, thereby achieving wide band width filter characteristics. Note that the narrow-pitch electrode finger portions N is not required in the present invention.

The impedance of the unbalanced terminal 5 is preferably set to about 50 Ω, and the impedance of the balanced terminals 6 and 7 is preferably set to about 150 Ω, for example.

In this preferred embodiment, the IDTs 11 to 15 and 16 to 20 are arranged such that the phase of a signal transmitted through the second wiring line 32 differs by 180 degrees from the phase of an electrical signal transmitted through the first wiring line 31. Accordingly, in the balanced SAW filter 1 having the cascaded first and second longitudinally-coupled-resonator SAW filter elements 3 and 4, components resulting from direct waves of the electrical signals transmitted to the first and second balanced terminals 6 and 7 are reduced significantly.

This will be described with reference to a specific experimental example.

The IDTs 11 to 15 and the reflectors 21a and 21b were formed on the piezoelectric substrate 2 in the following manner.

Specification of the first longitudinally-coupled-resonator SAW filter element 3

Interdigital width: 150 μm

Number of electrode fingers of the IDTs 11 to 15: 25(4)/(4)28(4)/(4)42(4)/(4)28(4)/(4)25 in the order of the IDTs 11 to 15 where the number in parentheses represents the number of electrode fingers included in the narrow-pitch electrode finger portions N, and the number not in parentheses represents the number of electrode fingers other than those included in the narrow-pitch electrode finger portion. For example, 25(4) is set to the IDT 11. This means that the IDT 11 has 25 electrode fingers other than those included in the narrow-pitch electrode finger portion, and the narrow-pitch electrode finger portion N including 4 electrode fingers.

Number of electrode fingers of the reflectors: 80

Metallization ratio: 0.70

Electrode film thickness: 0.082 λI (where λI is the wavelength determined by the pitch of electrode fingers other than those included in the narrow-pitch electrode finger portion N)

Specification of the second longitudinally-coupled-resonator SAW filter element 4

Interdigital width: 150 μm

Number of electrode fingers of the IDTs 11 to 15: 25(4)/(4)28(4)/(4)42(4)/(4)28(4)/(4)25 in the order of the IDTs 16 to 20 where the number in parentheses represents the number of electrode fingers included in the narrow-pitch electrode finger portions N, and the number not in parentheses represents the number of electrode fingers other than those included in the narrow-pitch electrode finger portion.

Although the eighth IDT at the center of the second longitudinally-coupled-resonator SAW filter element 4 has the first and second sub-IDT portions 18a and 18b, the number of electrode fingers of the eighth IDT is the same as that of the third IDT 13 at the center of the first longitudinally-coupled-resonator SAW filter element 4.

Number of electrode fingers of the reflectors: 80

Metallization ratio: 0.70

Electrode film thickness: 0.082 λI (where λI is the wavelength determined by the pitch of electrode fingers other than those included in the narrow-pitch electrode finger portion N)

Figure 2:
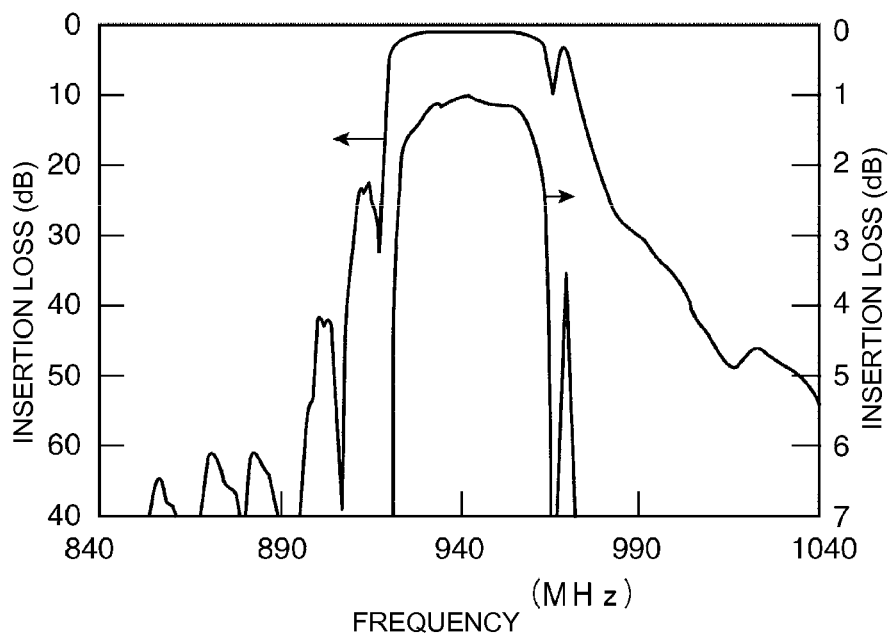
FIG. 2 is a graph showing attenuation-frequency characteristics of the balanced SAW filter shown in FIG. 1.
Figure 3:
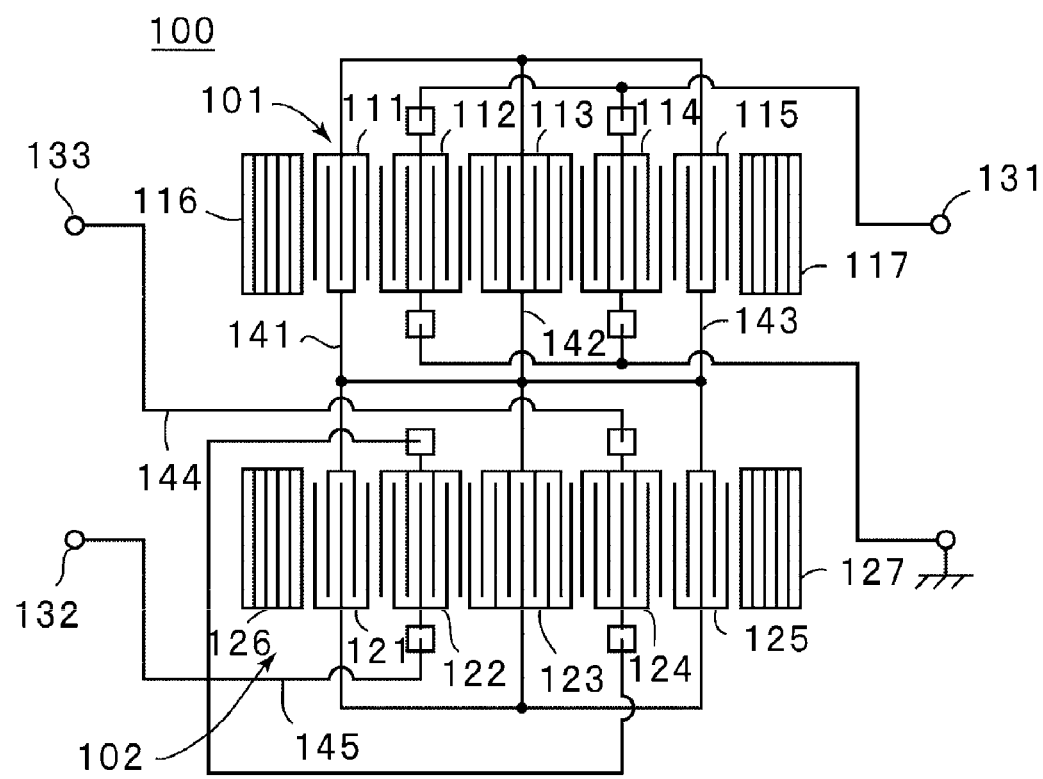
FIG. 3 is a schematic plan view showing an exemplary known balanced SAW filter.

FIG. 2 shows the attenuation-frequency characteristics of the balanced SAW filter 1 with the above-described structure. As shown in FIG. 2, the maximum insertion loss in the pass band was about 1.66 dB.

With the longitudinally-coupled-resonator SAW filter according to this preferred embodiment, the insertion loss in the pass band is reduced, as has been described above.

In addition, for example, referring to FIG. 1, the polarities of the adjacent outermost electrode fingers of the IDT 16 and the IDT 17 are negative and positive, negative and negative in the case of the IDT 17 and the IDT 18, negative and negative in the case of the IDT 18 and the IDT 19, and positive and negative in the case of the IDT 19 and the IDT 20.

Therefore, the polarity relationship among the adjacent outermost electrode fingers of the IDTs 16 and 18 connected to the first balanced terminal 6 and the adjacent outermost electrode fingers of the IDT 17 is the same as the polarity relationship among the adjacent outermost electrode fingers of the IDTs 18 and 20 connected to the second balanced terminal 7 and the adjacent outermost electrode fingers of the IDT 19. Accordingly, the balance between the first and second balanced terminals 6 and 7 is outstanding.

Since the bus bar 18e of the eighth IDT 18 is grounded in this preferred embodiment, the eighth IDT 18 is more fully grounded, and the insertion loss of the SAW filter is reduced. Alternatively, the bus bar 18e may be electrically floating. In that case, the eighth IDT 18 need not be provided with a ground pad electrode. Thus, the area of the piezoelectric substrate can be reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced SAW filter having an unbalanced terminal and first and second balanced terminals, comprising:
a piezoelectric substrate;
a first longitudinally-coupled-resonator SAW filter element provided on the piezoelectric substrate, the first longitudinally-coupled-resonator SAW filter element including first to fifth IDTs arranged in a propagation direction of surface acoustic waves, each of the first to fifth IDTs including a pair of bus bars;
a second longitudinally-coupled-resonator SAW filter element including, on the piezoelectric substrate, sixth to tenth IDTs arranged in the propagation direction of surface acoustic waves, the eighth IDT at a center including a pair of bus bars, one of the bus bars being divided to provide first and second sub-IDT portions, the first sub-IDT portion of the eighth IDT and the sixth IDT being connected to the first balanced terminal, the second sub-IDT portion of the eighth IDT and the tenth IDT being connected to the second balanced terminal, and first ends of the first, third, and fifth IDTs being connected to the unbalanced terminal;
a first wiring line connecting the second IDT to the seventh IDT; and
a second wiring line connecting the fourth IDT to the ninth IDT; wherein
the first to tenth IDTs are arranged such that the phase of an electrical signal transmitted through the first wiring line differs by 180 degrees from the phase of an electrical signal transmitted through the second wiring line.

2. The balanced SAW filter according to claim 1, wherein the bus bar of the eighth IDT of the second longitudinally-coupled-resonator SAW filter element, which is opposite to a side connected to the first and second balanced terminals, is grounded.

3. The balanced SAW filter according to claim 1, wherein the bus bar of the eighth IDT of the second longitudinally-coupled-resonator SAW filter element, which is opposite to a side connected to the first and second balanced terminals, is electrically floating.

4. The balanced SAW filter according to claim 1, wherein at least one of the first to tenth IDTs includes narrow-pitch electrode finger portions at ends thereof.

5. The balanced SAW filter according to claim 1, wherein each of the first to tenth IDTs includes narrow-pitch electrode finger portions at ends thereof.

* * * * *